(12) United States Patent
Boescke

(10) Patent No.: US 8,304,823 B2
(45) Date of Patent: Nov. 6, 2012

(54) INTEGRATED CIRCUIT INCLUDING A FERROELECTRIC MEMORY CELL AND METHOD OF MANUFACTURING THE SAME

(75) Inventor: Tim Boescke, Dresden (DE)

(73) Assignee: NaMLab gGmbH, Dresden (DE)

( * ) Notice: Subject to any disclaimer, the term of this patent is extended or adjusted under 35 U.S.C. 154(b) by 391 days.

(21) Appl. No.: 12/106,741

(22) Filed: Apr. 21, 2008

(65) Prior Publication Data
US 2009/0261395 A1 Oct. 22, 2009

(51) Int. Cl.
*H01L 21/02* (2006.01)

(52) U.S. Cl. ............... 257/295; 257/296; 257/E27.104; 257/E21.208

(58) Field of Classification Search ............ 257/295, 257/296, E21.208, E27.104
See application file for complete search history.

(56) References Cited

U.S. PATENT DOCUMENTS

| 6,255,121 B1 | 7/2001 | Arita et al. |
| 7,226,795 B2 | 6/2007 | Sakai |
| 2004/0214352 A1 * | 10/2004 | Kijima et al. ............ 438/3 |
| 2006/0017120 A1 * | 1/2006 | Sakai ............... 257/410 |
| 2006/0044863 A1 * | 3/2006 | Basceri et al. ............ 365/145 |
| 2006/0056225 A1 * | 3/2006 | Hashimoto et al. ........ 365/145 |

FOREIGN PATENT DOCUMENTS

| DE | 10046021 A1 | 5/2001 |
| DE | 102004011432 A1 | 9/2005 |

OTHER PUBLICATIONS

Kakemoto, H.; Kakimoto, K.; Baba, A.; Fujita, S.; Masuda, Y.; , "Ferroelectric properties of BaTi0.91(Hf0.5Zr 0.5)0.09O3 thin films fabricated by pulsed laser deposition method," Applications of Ferroelectrics, 2000. ISAF 2000. Proceedings of the 2000 12th IEEE International Symposium on , vol. 2, No., pp. 603-606 vol. 2, 2000.*

* cited by examiner

*Primary Examiner* — Jarrett Stark
(74) *Attorney, Agent, or Firm* — Edell, Shapiro & Finnan, LLC

(57) ABSTRACT

A method for manufacturing an integrated circuit including a ferroelectric memory cell is disclosed. One embodiment of the method includes: forming a amorphous oxide layer over a carrier, the amorphous layer including: O and any of the group of: Hf, Zr and (Hf,Zr), forming a covering layer on the amorphous layer, and heating the amorphous layer up to a temperature above its crystallization temperature to at least partly alter its crystal state from amorphous to crystalline, resulting in a crystallized oxide layer.

29 Claims, 8 Drawing Sheets

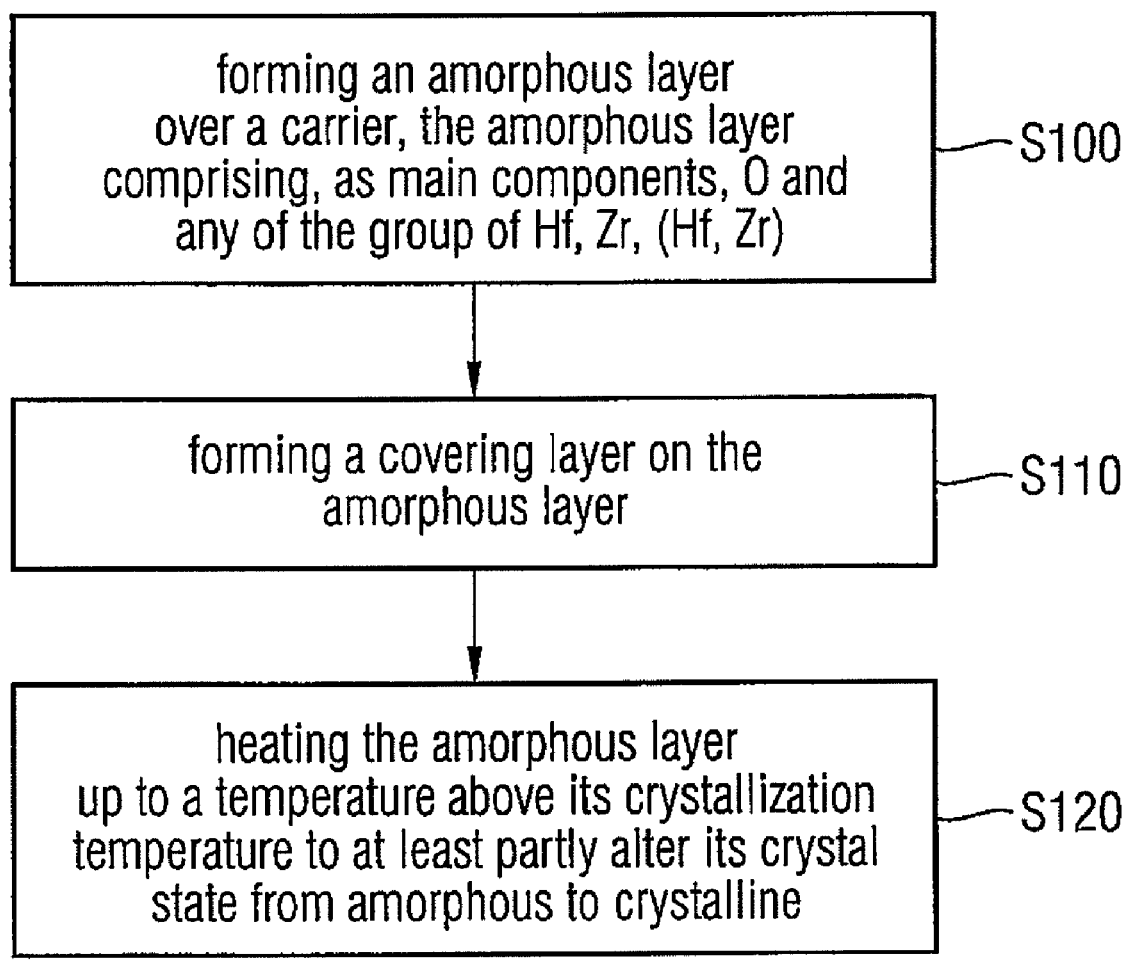

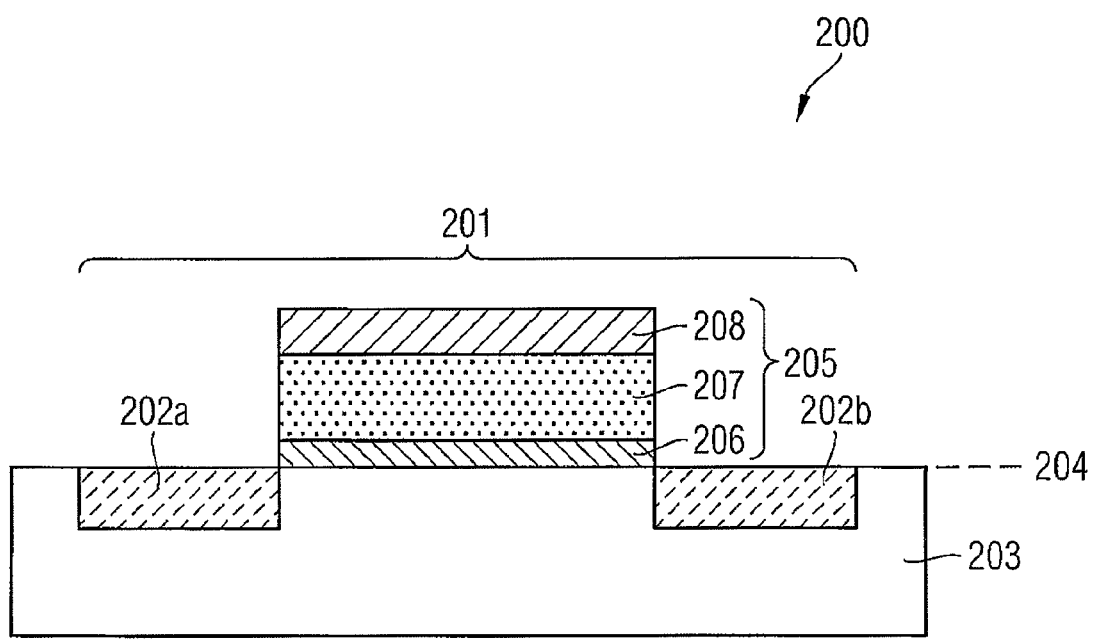
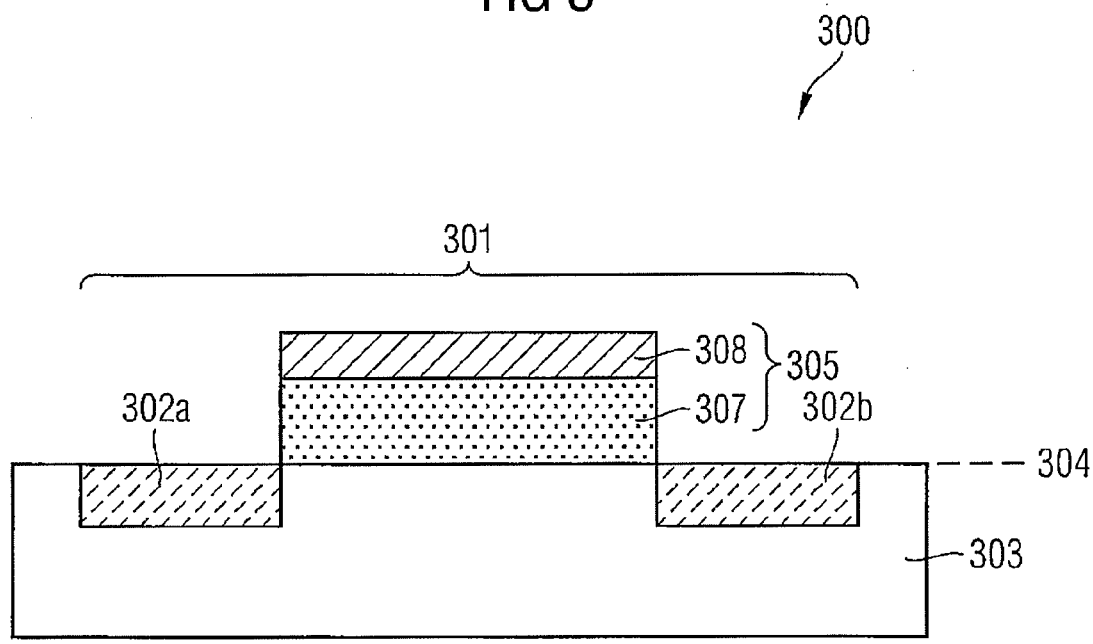

|  | Vg | Vd | Vs | Vb |
|---|---|---|---|---|
| Quiescent state | 0V | 0V | 0V | 0V |
| Read | Vr | Vdr | 0V | 0V |
| Write '0' | +Vp | 0V | 0V | 0V |
| Write '1' | −Vp | 0V | 0V | 0V |

INTEGRATED CIRCUIT INCLUDING A FERROELECTRIC MEMORY CELL AND METHOD OF MANUFACTURING THE SAME

BACKGROUND

Demands on semiconductor memory devices towards larger storage capacity and faster access speeds are increasing. The semiconductor industry offers a variety of semiconductor memory types. Semiconductor memory types may be categorized in volatile and non-volatile memories. A prominent volatile memory is the DRAM (Dynamic Random Access Memory) allowing for high speed and high capacity data storage. As non-volatile memories, the semiconductor industry is engaged in ROM (Read-only-Memory) (e.g., EPROM (Erasable Programmable ROM) and EEPROM (Electrically Erasable Programmable ROM), FeRAM (Ferroelectric RAM) and MRAM (Magnetoresistive RAM)).

With regard to FeRAM, a ferroelectric layer is used to store information. In a FeRAM having a 1T-1C (1 Transistor-1 Capacitor) storage cell design, similar in construction to a DRAM memory cell, one capacitor and one access transistor form the memory cell. Opposed to a DRAM cell capacitor having a linear dielectric, a FeRAM cell capacitor includes a dielectric structure based on ferroelectric material. This ferroelectric material has a non-linear relationship between the applied electric field and the apparent stored charge resulting in a ferroelectric characteristic in the form of a hysteresis loop. Besides the 1T-1C FeRAM concept, an alternative cell concept allowing for an even more compact cell design is the 1T (1 Transistor) FeRAM based on a ferroelectric field effect transistor (FeFET). In the FeFET, the gate isolation includes a ferroelectric dielectric. The threshold voltage of the FeFET depends upon the polarization of the ferroelectric dielectric.

SUMMARY

Described herein is an embodiment of a method for manufacturing an integrated circuit including a ferroelectric memory cell. The method comprises: forming an amorphous oxide layer over a carrier, the amorphous layer comprising: as main components, O and any of the group consisting of: Hf, Zr and (Hf,Zr), forming a covering layer on the amorphous layer, and heating the amorphous layer up to a temperature above its crystallization temperature to at least partly alter its crystal state from amorphous to crystalline, resulting in a crystallized oxide layer.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The accompanying drawings are included to provide a further understanding of the embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1A is a flowchart illustrating one embodiment of a method for manufacturing an integrated circuit including a ferroelectric memory cell.

FIG. 2 illustrates a simplified cross-sectional view of one embodiment of an integrated circuit including a planar 1T ferroelectric memory cell.

FIG. 3 illustrates a cross-sectional view of one embodiment of an integrated circuit including a planar 1T ferroelectric memory cell.

DETAILED DESCRIPTION

Figure 1B:
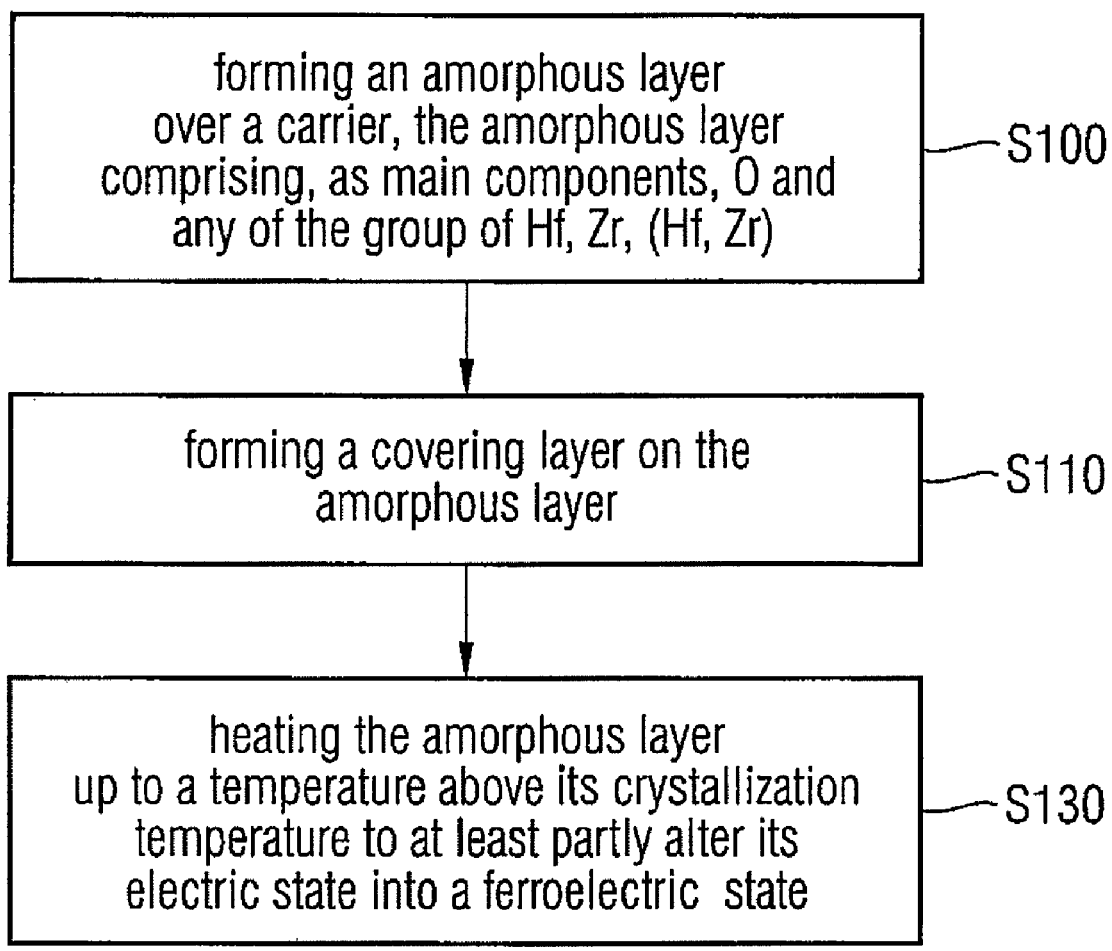
FIG. 1B is a flowchart illustrating a further embodiment of a method for manufacturing an integrated circuit including a ferroelectric memory cell.

In the following detailed description, reference is made to the accompanying drawings, which form a part hereof and in which are shown by way of illustration specific embodiments in which the invention may be practiced. In this regard directional terminology, such as "top", "bottom", "front", "back", etc. is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description therefore is not to be taken in a limiting sense, and the scope of the present invention is defined by the appended claims.

It is to be understood that the features of the various exemplary embodiments described herein may be combined with each other, unless specifically noted otherwise. FIG. 1A is a flowchart illustrating one embodiment of a method for manufacturing an integrated circuit including a ferroelectric memory cell. At S100, an amorphous layer is formed over a carrier, the amorphous layer comprising, as main components, O and any of the group of Hf, Zr and (Hf,Zr). Thereafter at S110, a covering layer is formed on the amorphous layer. The covering layer may be a dielectric or a conducting oxide or a metal electrode, for example. A deposition temperature of the covering layer may be below the crystallization temperature of the amorphous layer. Then, at S120, the amorphous layer is heated up to a temperature above its crystallization temperature to at least partly alter its crystal state from amorphous to crystalline resulting in a crystallized oxide layer.

The carrier may be composed of Si, a Si compound such as SiGe, silicon-on-insulator (SOI), III-V semiconductor compounds such as GaAs or any other suitable substrate material. The carrier may also be formed as a semiconductor layer, e.g., epitaxial layer, on a substrate. Components and devices may already be formed within the carrier. The amorphous layer may be formed by atomic layer deposition (ALD), metal organic atomic layer deposition (MOALD), chemical vapor deposition (CVD), metal organic chemical vapor deposition (MOCVD), physical vapor deposition (PVD), or any other suitable deposition technique providing an amorphous layer. Precursors may be used to introduce any elements of the group consisting of: Hf, Zr and (Hf,Zr) (i.e., Hf and Zr in combination) into the amorphous layer, for example. A thickness of the amorphous layer may be chosen in the range of 2 to 100 nm, for example. As a further example, the thickness of the amorphous layer may be chosen in the range of 4 to 15 nm.

When heating the amorphous layer to at least partly alter its crystal state from amorphous to crystalline, the temperature may be chosen in a range of 400° C. to 1200° C., for example. As a further example, the temperature may range from 700° C. to 1100° C. When at last partially crystallizing the amorphous layer having the covering layer formed thereon, the crystallized parts of the layer, e.g., oxide layer, may include ferroelectric domains or may be, as a whole, in a ferroelectric state. This crystallized layer may exhibit different dipole moments and may thus effect the conductivity of a FeFET channel, for example. In this way, the dipole orientation of the ferroelectric crystallized oxide layer may be utilized for storage of an information state. The information state may be determined by measuring a current and/or a voltage through the channel of the FeFET, for example. As an alternative, the crystallized oxide layer having ferroelectric properties may be utilized to form the capacitor dielectric of a 1T-1C FeRAM. The crystallized oxide layer may be, at least partly, in an orthorhombic crystalline state.

The covering layer facilitates the phase transition of the amorphous layer from the amorphous state to the crystalline state comprising ferroelectric properties. The heating of the amorphous layer altering its crystal state may be effected by a particular anneal or may be carried out as a standard anneal of a respective semiconductor manufacturing process.

The covering layer and the amorphous layer may be patterned before altering the crystal state of the amorphous layer. For example, the patterning of these layers may be carried out by an etch process using an etch mask (e.g., a hard mask). The patterning of the covering layer and the amorphous layer may be adapted to the intended use of these layers. For example, the covering layer and the amorphous layer may be patterned to define at least part of a gate stack of a 1T FeRAM (FeFET) or these layers may be patterned to define a capacitor dielectric of 1T-1C FeRAM. Etching of the amorphous layer may be more easily achieved than etching of the crystallized oxide layer.

After patterning the covering layer and the amorphous layer and before altering the crystal state of the amorphous layer, a spacer structure may be formed on sidewalls of the amorphous layer and the covering layer.

The covering layer and the amorphous layer may also be patterned after at least partly altering the crystal state of the amorphous layer from amorphous to crystalline. In this case, the crystallization may be advantageously controlled.

The amorphous layer and the covering layer may also be formed in a same deposition process by changing the supply of source materials. This same deposition process will be carried out in a single deposition chamber. For example, when forming the amorphous layer of hafnium oxide and the covering layer of silicon oxide, a precursor gas including oxygen may be continuously provided during deposition of the amorphous layer and the covering layer. During formation of the amorphous layer a precursor gas including hafnium may, in addition to the precursor gas including oxygen, flow into the deposition chamber. After completing the amorphous layer, the supply of the precursor gas including hafnium may be stopped and another precursor gas including silicon, may be fed into the deposition chamber to form the covering layer of $SiO_2$, for example. It is to be noted that above elucidation related to an amorphous layer of hafnium oxide and a covering layer of silicon oxide is to be considered merely as an example and, by appropriately choosing the supply of the precursor gases, a variety of amorphous layers and covering layers may be provided. For example, the covering layer may comprise any of: $SiO_2$, $Al_2O_3$, $Sc_2O_3$, $Y_2O_3$, BaO, MgO, SrO, $Ta_xO_y$, $Nb_xO_y$, TiO, or lanthan dioxides.

The amorphous layer and the covering layer may also be formed separately. In this regard, the term "separately" refers to different processes of forming the amorphous layer and the covering layer. For example, formation of the amorphous oxide layer and the covering layer may be carried out in different deposition chambers. These layers may also be formed by different deposition techniques. For example, the amorphous layer may be formed in a deposition chamber only used for formation of dielectric layers. The covering layer may be formed in a different deposition chamber used to form material layers containing metals (e.g., TiN).

The term "main components" is to be understood such that a number of O and any of Hf, Zr and (Hf, Zr) per volumetric content (e.g., unit cell), is higher compared to any other components or further additives. Such additives may be introduced into the amorphous layer. The amorphous layer may comprise hafnium oxide, zirconium oxide or a mixed oxide comprising hafnium oxide and zirconium oxide. In general, the main components of the amorphous layer may form any compound.

For example, the amorphous layer may be simultaneously formed of the main components and the further additives. As an alternative, the further additives may also be introduced after formation of the main components of the amorphous layer by ion implantation, for example. The introduction of the further additives into the amorphous layer may support the crystallization into a state having ferroelectric properties. A concentration of the further additives may be set within a range of 0.5% to 20%. As a further example, the concentration of the further additives may be set within a range of 1% to 4%. In general, the amount of the further additives may depend on the thickness of the amorphous layer. When increasing the thickness of the amorphous layer, the concentration of the further additives may also have to be increased to achieve a desired crystallization having ferroelectric properties. There may also exist a thickness allowing for a desired crystallization of the amorphous layer without introducing the further additives. For example, the further additives may be chosen from the group of: Si, Al, Ge, Mg, Ca, Sr, Ba, Ti and rare earth elements. For example, the amorphous layer may comprise HfSiO.

Before formation of the amorphous layer, an insulating buffer layer may be formed over the carrier. The insulating buffer layer may be $SiO_2$ or SiON and may be formed by using a chemical oxide or a thermal oxide, such as RTNO (Rapid Thermal Nitridation/Oxidation) or ISSG (In Situ Steam Generation)-Oxide. A thickness of the insulating buffer layer may range between 0.3 to 6 nm or optionally, between 0.5 to 3 nm.

Over the covering layer, a conductive layer may be formed. The conductive layer may comprise a material chosen from the group consisting of: TiN, TaN, TaCN, WCN, Ru, Re, RuO, Pt, Ir, IrO, Ti, TiAlN, TaAlN, W, WN, C, Si, Ge, SiGe and NbCN.

The covering layer may also be formed of a conductive material. For example, the conductive material may be chosen from the group consisting of: TiN, TaN, TaCN, WCN, Ru, Re, RuO, Pt, Ir, IrO, Ti, TiAlN, TaAlN, W, WN, C, Si, Ge, SiGe and NbCN. The covering layer may thus form at least part of a metal gate of a 1T FeRAM.

FIG. 1B is a flowchart illustrating a further embodiment of a method for manufacturing an integrated circuit including a ferroelectric memory cell. At S100, similarly to the embodiment shown in FIG. 1A, an amorphous layer is formed over a carrier, the amorphous layer comprising, as main components, O and any of the group consisting of: Hf, Zr and (Hf,Zr). Thereafter, at S110, similarly to the embodiment shown in FIG. 1A, a covering layer is formed on the amorphous layer. The covering layer may be a dielectric or a conducting oxide or a metal electrode, for example. A deposition temperature of the covering layer may be below the crystallization temperature of the amorphous layer. Then, at S130, the amorphous layer is heated up to a temperature above its crystallization temperature to at least partly alter its electric state into a ferroelectric state.

Source/drain regions of the ferroelectric memory cells may be formed before, after or together with the ferroelectric layer.

FIG. 2 illustrates a cross-sectional view of one embodiment of an integrated circuit 200 including a planar 1T ferroelectric memory cell 201 (FeFET 201). Ferroelectric memory cell 201 includes source/drain regions 202a, 202b formed within a carrier 203. Over a surface 204 of carrier 203, a gate layer stack 205 is formed. The gate layer stack 205 includes: insulating buffer layer 206, crystallized oxide layer 207 and covering layer 208.

The crystallized oxide layer 207 includes crystalline regions having ferroelectric properties and is formed as elucidated with reference to FIG. 1A or FIG. 1B. Properties of carrier 203, insulating buffer layer 206, crystallized oxide layer 207 and covering layer 208 may be chosen according to the specifications given above with reference to FIG. 1A and FIG. 1B. Covering layer 208 may be a conductive layer forming at least part of a metal gate. It is to be understood that the schematic cross-sectional view of integrated circuit 200 illustrated in FIG. 2 merely refers to part of the integrated circuit 200. Therefore, integrated circuit 200 may comprise a plurality of ferroelectric memory cells 201 arranged in the form of a ferroelectric memory cell array, for example. Furthermore, additional circuits may be formed in carrier 203. For example, these additional circuits may include word line drive circuits, bit line drive circuits, source line drive circuits, sense circuits, control circuits, for example. In general, any semiconductor devices (e.g., diodes, bipolar transistors, diffusion resistors, silicon controlled rectifiers (SCR), field effect transistors (FET)) may be formed within carrier 203. Over carrier 203, a wiring area including a stack of conductive layers (e.g., metal layers, and intermediate dielectrics) may be formed. The wiring area may be used to interconnect semiconductor devices or circuit parts of integrated circuit 200.

FIG. 3 illustrates a cross-sectional view of one embodiment of an integrated circuit 300 including a planar 1T ferroelectric memory cell 301. Ferroelectric memory cell 301 includes source/drain regions 302a, 302b formed within a carrier 303. Over a surface 304 of carrier 303, a gate layer stack 305 is formed. The gate layer stack 305 includes crystallized oxide layer 307 and covering layer 308.

The embodiment illustrated in FIG. 3 differs from the embodiment illustrated in FIG. 2 by omission of an insulating buffer layer. Hence, crystallized oxide layer 307 is formed on the carrier 303. The details given with regard to layers 202a, 202b, 203, 207, 208 above also hold true for layers 303a, 302b, 303, 307, 308, respectively.

Figure 4:
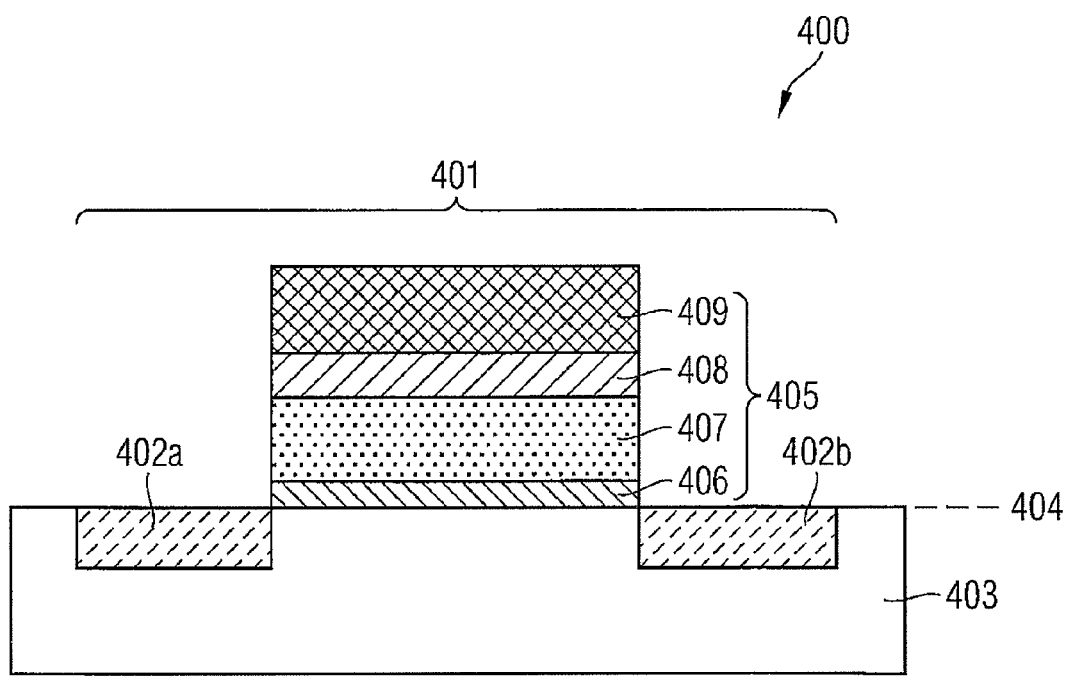
FIG. 4 illustrates a simplified cross-sectional view of one embodiment of an integrated circuit including a planar 1T ferroelectric memory cell.

FIG. 4 illustrates a cross-sectional view of one embodiment of an integrated circuit 400 including a planar 1T ferroelectric memory cell 401. Ferroelectric memory cell 401 includes source/drain regions 402a, 402b formed within a carrier 403. Over a surface 404 of carrier 403, a gate layer stack 405 is formed. The gate layer stack 405 includes insulating buffer layer 406, crystallized oxide layer 407, covering layer 408 and top gate 409.

Covering layer 408 may be a dielectric layer (e.g., $SiO_2$ or $Al_2O_3$). Covering layer 408 and crystallized oxide layer 407 may also be formed in a same deposition process (i.e., in-situ). Top gate 409 may include or correspond to the conductive layer elucidated with reference to the embodiment illustrated in FIG. 1A.

Figure 5:
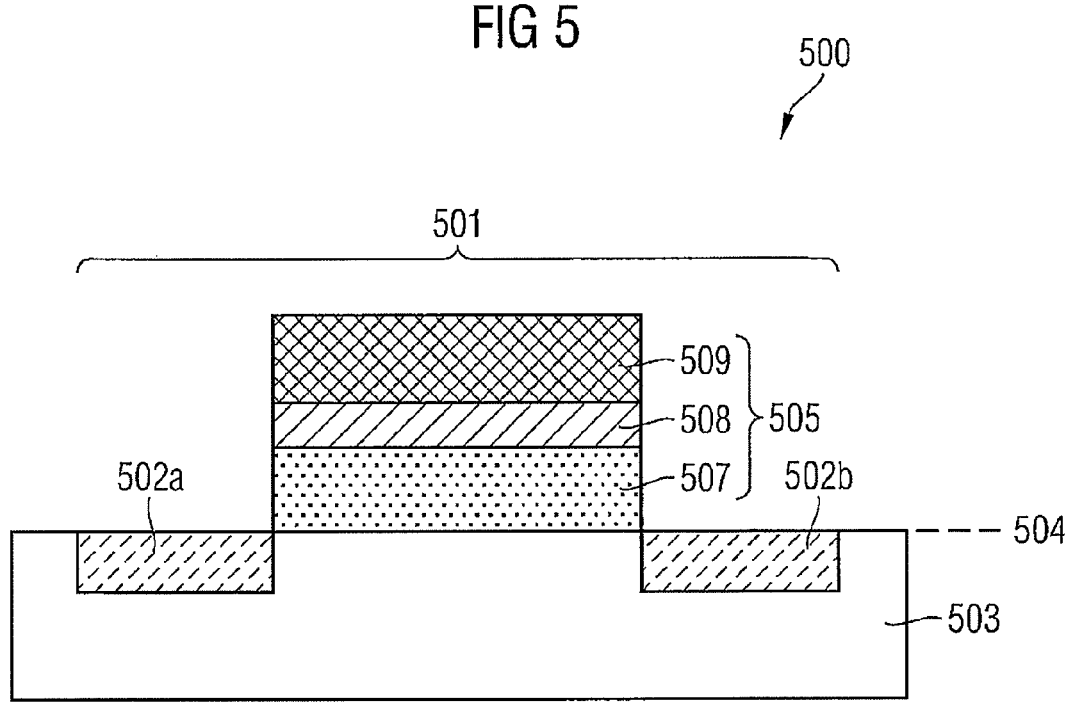
FIG. 5 illustrates a simplified cross-sectional view of one embodiment of an integrated circuit including a planar 1T ferroelectric memory cell.

FIG. 5 illustrates a cross-sectional view of one embodiment of an integrated circuit 500 including a planar 1T ferroelectric memory cell 501. Ferroelectric memory cell 501 includes source/drain regions 502a, 502b formed within a carrier 503. Over a surface 504 of carrier 503, a gate layer stack 505 is formed. The gate layer stack 505 includes crystallized oxide layer 507, covering layer 508 and top gate 509.

The embodiment illustrated in FIG. 5 differs from the embodiment illustrated in FIG. 4 by omission of an insulating buffer layer.

Figure 6A:
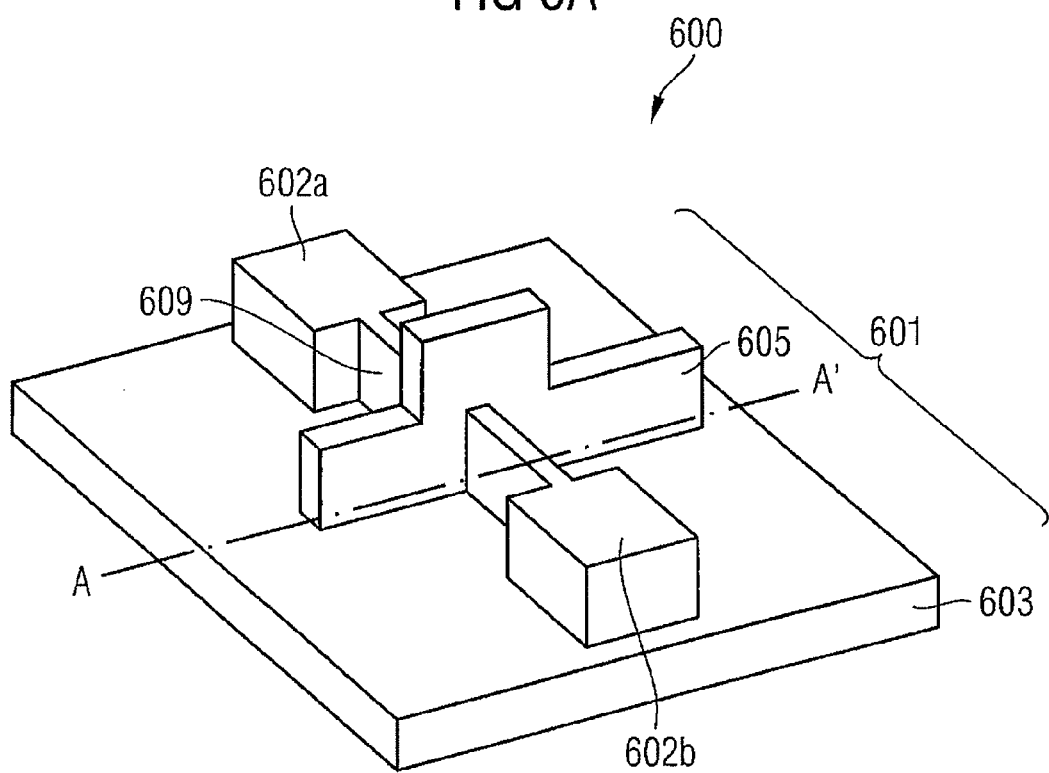
FIG. 6A illustrates a schematic view of one embodiment of an integrated circuit including a 3D 1T ferroelectric memory cell.

FIG. 6A illustrates a cross-sectional view of one embodiment of an integrated circuit 600 including a 3D 1T ferroelectric memory cell 601 (1T 3D FeFET). The 3D FeFET 601 is formed as a FeFinFET and comprises source/drain regions 602a, 602b formed on or within carrier 603. Between source/drain regions 602a, 602b, a fin 609 is formed. For example, source/drain regions 602a, 602b and fin 609 may be formed within a same semiconductor layer (e.g., carrier 603). A gate layer stack 605 covers at least part of the sidewalls and a top side of fin 609. An active area of FinFET 601 may be electrically isolated from a substrate by a buried insulating layer. As a further example, the active area may be electrically coupled to the substrate, wherein the gate layer stack 605 may be arranged within STI (Shallow Trench Isolation) regions.

Figure 6B:
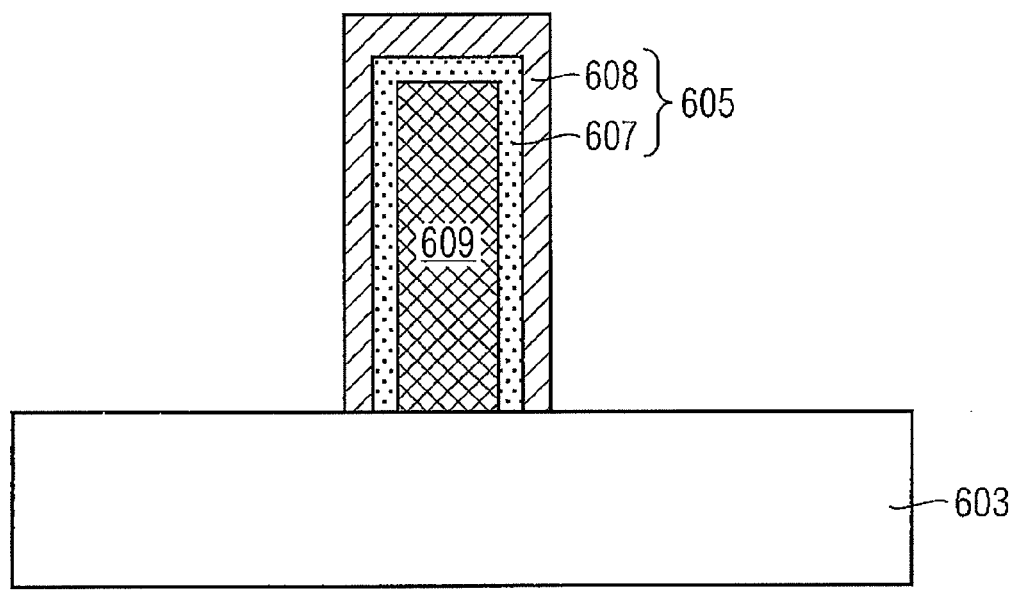
FIG. 6B illustrates a cross-sectional view taken along a cut line A-A' of the embodiment illustrated in FIG. 6A.

FIG. 6B illustrates a schematic cross-sectional view taken along cutline A-A' of the FeFinFET of FIG. 6A. Gate layer stack 605 includes crystallized oxide layer 607 and covering layer 608. It is to be noted that further layers (e.g., conductive layers) may be provided on covering layer 608 forming a top gate. Furthermore, an insulating buffer layer may be sandwiched between fin 609 and crystallized oxide layer 607. Reference is also taken to the previous embodiments in view of alternative gate layer stacks and choice of layer properties. Fin 609 may be defined as a part of a substrate by an etch process, for example.

It is to be noted that the memory cell transistor including crystallized oxide layer and covering layer may have any suitable geometry (e.g., planar or 3D geometry) such as, for example, Trench MOSFET, FinFET, RCAT ("Recessed Channel Array Transistor"), TSNWFET ("Twin Silicon NanoWire Field Effect Transistor"), PiFET ("Partially insulated Field Effect Transistor"), McFET ("Multi-channel Field Effect Transistor").

In the following, basic operation of one embodiment of a FeFET will be elucidated with reference to FIGS. 7A-7C.

Figures 7A, 7B:
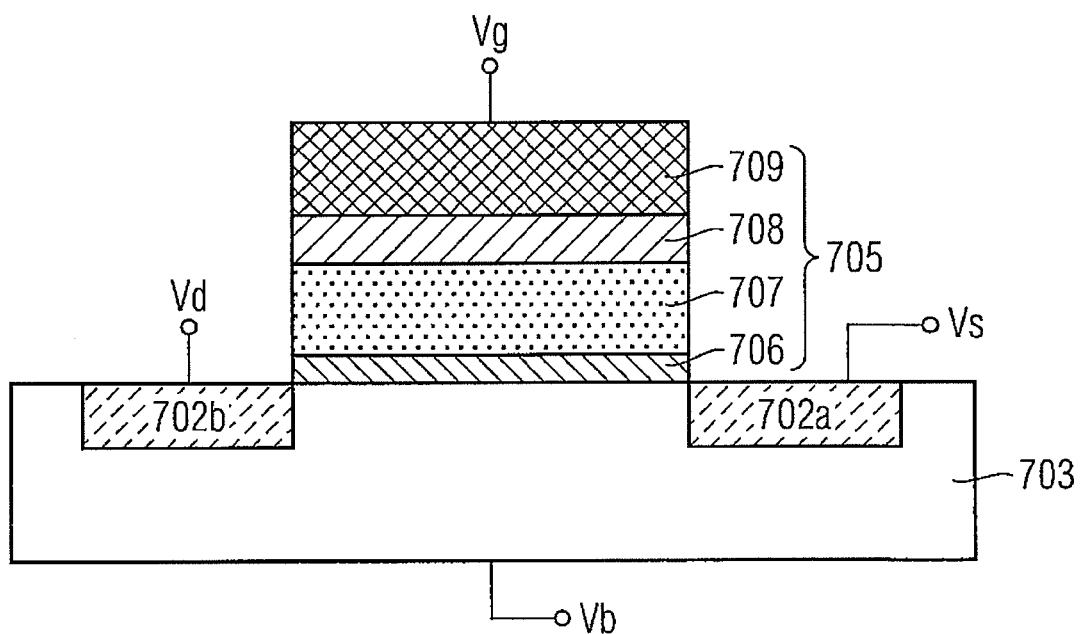
FIG. 7A illustrates one embodiment of an integrated circuit including a 1T ferroelectric memory cell and connections provided to the memory cell transistor.
FIG. 7B is a diagram illustrating exemplary operation conditions of the 1T memory cell illustrated in FIG. 7A.

FIG. 7A illustrates a cross-sectional view of one embodiment of a FeFET 701 including source region 702a and drain region 702b formed within carrier 703. Gate layer stack 705 includes insulating buffer layer 706, crystallized oxide layer 707, covering layer 708 and top gate 709. Top gate 709 is coupled to gate voltage Vg, drain region 702b is coupled to drain voltage Vd, source region 702a is coupled to source voltage Vs and a bulk region including source/drain regions 702a, 702b embedded therein is coupled to bulk voltage Vb. The bulk region is of opposite conductivity than that of the source/drain regions 702a, 702b. For example, bulk region may be formed as a p-type well having n-type source/drain regions 702a, 702b embedded therein (not illustrated in FIG. 7A). For example, drain voltage Vd may be supplied by first bit lines (not illustrated in FIG. 7A), source voltage Vs may be supplied by second bit lines (not shown in FIG. 7A), gate voltage Vg may be supplied by word lines (not illustrated in FIG. 7A) and bulk voltage Vb may be supplied by source lines (not illustrated in FIG. 7A), for example.

FIG. 7B illustrates a table elucidating different operating states of the FeFET 701 illustrated in FIG. 7A. The voltages given for the different operating states are to be considered merely as an example and by no way limiting.

In quiescent state, voltages Vd, Vg, Vs, Vb are set to 0 V. In operation state "read", information is read from the FeFET by sensing the current between source region 702a and drain region 702b. Therefore, gate voltage Vg is set to Vr, drain voltage Vd is set to Vdr and source and bulk voltages Vs, Vb are set to 0 V.

Assuming an n-channel FeFET, Vr and Vdr will be set to values exceeding 0 V. In operation state "write 0", binary information state "0" is written to the FeFET 701 by setting the gate voltage Vg to Vp and by setting Vd, Vs, Vb to 0 V. Vp may be provided as a voltage pulse, for example. For example, an amplitude of such a voltage pulse may be in a range of 0.5 V to 10V, or optionally in a range of 1.5 V to 3 V. Hence, an electric field between bulk and top gate 709 turns crystallized oxide layer 707 comprising ferroelectric properties into a first polarization state associated with the information state "0". When setting gate voltage Vg to −Vp and Vd, Vs, Vb to 0 V, the electric field between bulk and top gate 709 is reversed and operation state "write 1" is set. In this operation state, crystallized oxide layer 707 is set into a second polarization state associated with binary information state "1" that is different from the first polarization state. Hence, operation states "0", "1" can be ascribed to different polarization states of crystallized oxide layer 707. These different polarization states result in different threshold voltages of the FeFET. Read-out from the FeFET may be non-destructive.

Figure 7C:
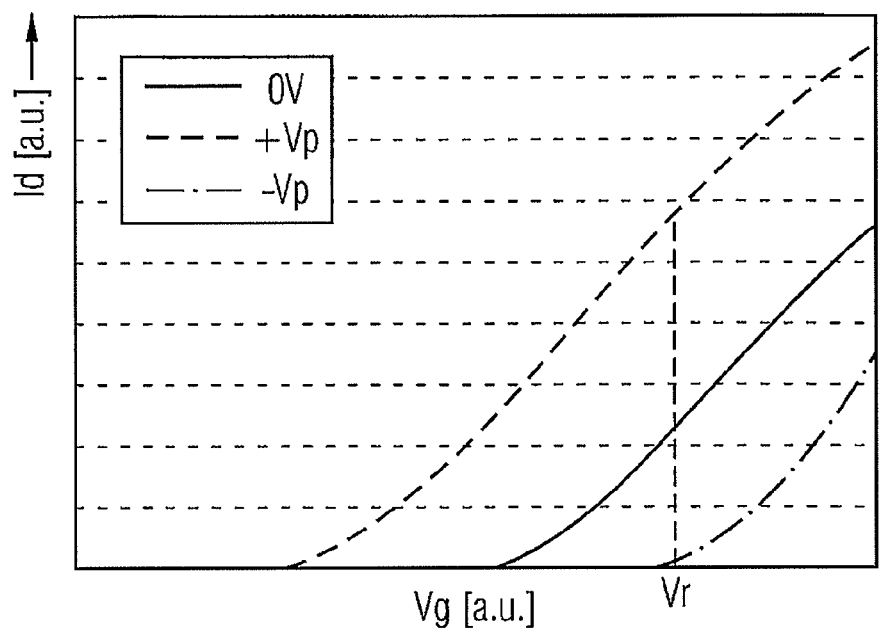
FIG. 7C is a diagram schematically illustrating drain current versus gate voltage of the 1T memory cell illustrated in FIG. 7A for different polarization states of the ferroelectric layer.

FIG. 7C is a diagram illustrating a drain current Id against gate voltage Vg. The diagram rests on source region 702a coupled to 0 V and drain region 702b coupled to Vdr. The upper curve marked "+Vp" refers to information state "0" and the lower curve marked "−Vp" refers to information state "1". The offset of curves marked "+Vp" and "−Vp" is due to the shift in the threshold voltage of the FeFET ascribed to different polarization states of crystallized oxide layer 707 as elucidated above. When reading information from the FeFET, gate voltage Vg may be set to Vr. Information state "0" ascribed to curve marked "+Vp" results in a larger source/drain current than information state "1" associated with lower curve marked "−Vp". Hence, information states "0", "1" may be distinguished by the current flowing between source and drain, respectively.

Figure 8:
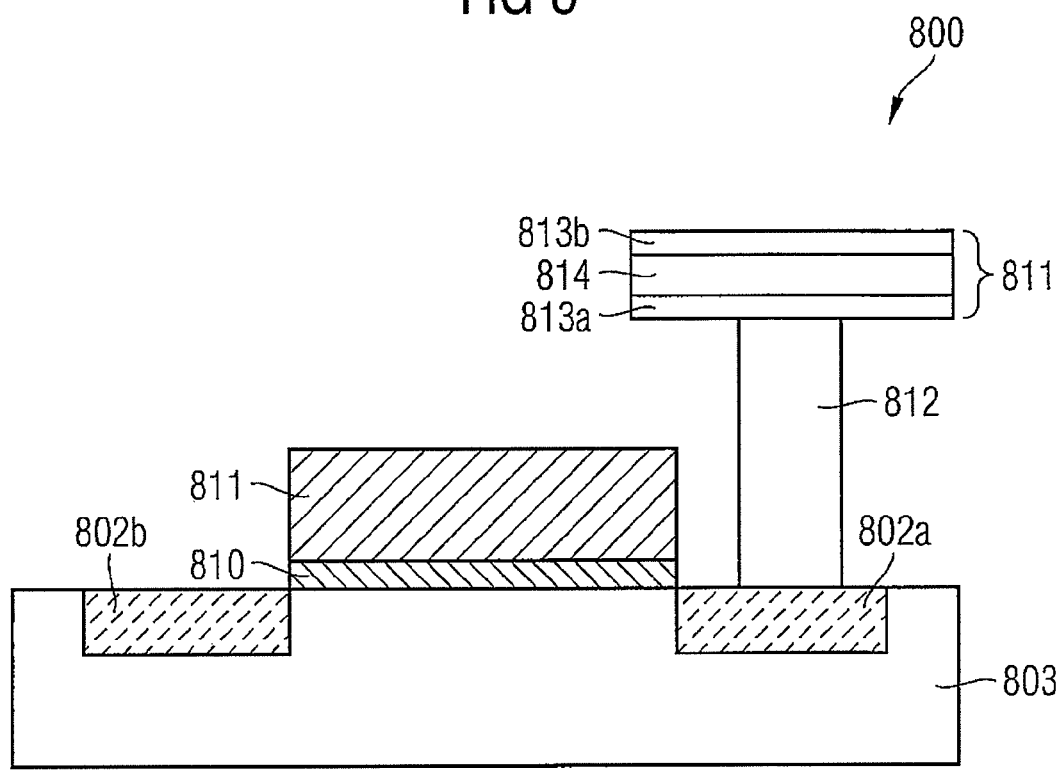
FIG. 8 illustrates a schematic view of one embodiment of an integrated circuit including a 1T-1C ferroelectric memory cell.

FIG. 8 illustrates one embodiment of an integrated circuit 800 including a 1T-1C FeRAM memory cell including source/drain regions 802a, 802b formed within carrier 803. Different from the embodiments illustrated in FIGS. 2-7C related to FeFETs, the 1T-1C memory cell illustrated in FIG. 8 includes a conventional FET acting as an access transistor. The FET includes dielectric layer 810 and gate 811. Source/drain region 802a is coupled to a capacitor 811 via an interconnection structure (e.g., a contact plug 812). Capacitor 811 includes first and second electrodes 813a, 813b. Capacitor dielectric 814 includes at least the crystallized oxide layer comprising ferroelectric properties and the covering layer as elucidated in detail above with reference to FIG. 1. Thus, the 1T-1C FeRAM illustrated in FIG. 8 includes a ferroelectric dielectric based on the crystallized oxide layer.

Figure 9:
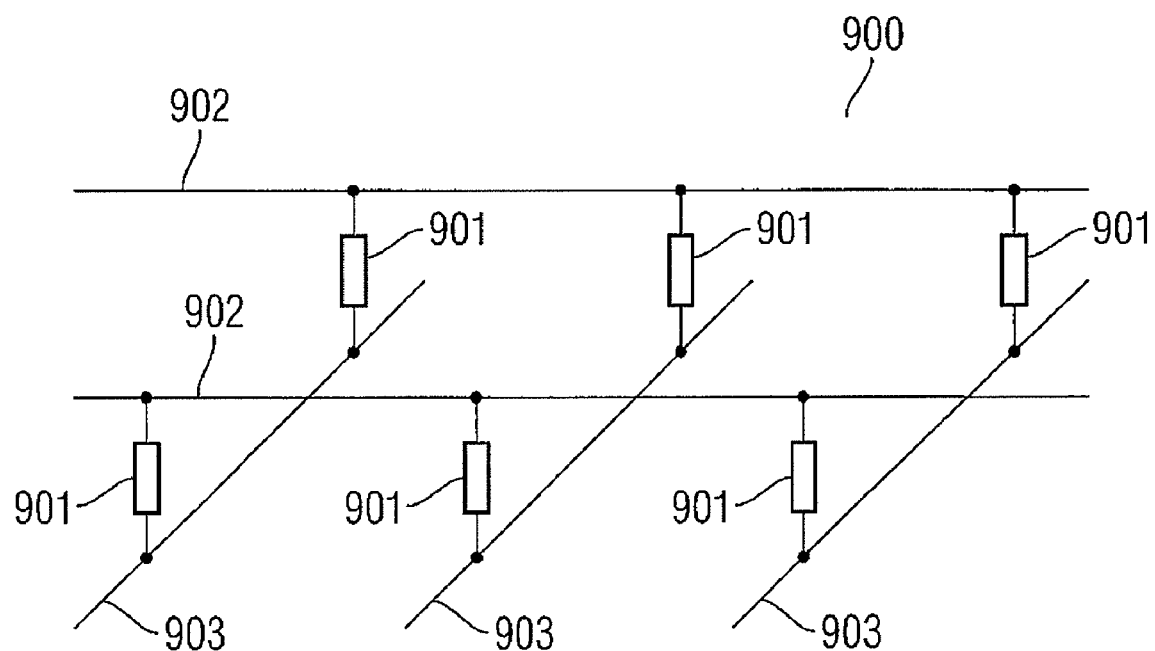
FIG. 9 illustrates a schematic view of one embodiment of an integrated circuit including an array of ferroelectric memory cells.

FIG. 9 illustrates one embodiment of an integrated circuit 900 including a ferroelectric memory cell array. The ferroelectric memory cell array comprises ferroelectric memory cells 901. Each of the ferroelectric memory cells 901 is connected of one of a plurality of first lines 902 (e.g., wordlines) and to one of a plurality of second lines 903 (e.g., bitlines). The first lines and second lines may run perpendicular to each other, for example. Each of the first and second lines may be connected to a support circuit (not shown in FIG. 9) configured to support a read/write operation with respect to the ferroelectric memory cells 901. The ferroelectric memory cells 901 may be any of the memory cells illustrated above and may be formed by any of above manufacturing methods. Source/drain regions of memory cell transistors may be electrically coupled to the bitlines and gate electrodes of the memory cell transistors may be electrically coupled to the wordlines.

While specific embodiment described herein are substantially focused on 1T ferroelectric memory cells (FeFETS) and 1T-1C ferroelectric memory cells, it is to be understood that the present invention can be applied to any suitable type of ferroelectric memory cell (e.g., 2T-2C memory cells).

Although specific embodiments have been illustrated and described herein, it will be appreciated by those of ordinary skilled in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit including a ferroelectric memory cell, the ferroelectric memory cell comprising:
   an oxide storage layer being at least partly in a ferroelectric state and comprising, as main components, oxygen and any of the group consisting of: Hf, Zr and (Hf,Zr); and
   a covering layer on the oxide storage layer.

2. The integrated circuit of claim 1, wherein the covering layer comprises a conductive material.

3. The integrated circuit of claim 1, further comprising a conductive layer over the covering layer.

4. The integrated circuit of claim 1, wherein the oxide storage layer and the covering layer form at least part of a capacitor of a FeRAM.

5. The integrated circuit of claim 1, wherein the oxide storage layer comprises further additives of a concentration within a range of 0.5% to 20%.

6. The integrated circuit of claim 1, wherein the oxide storage layer and the covering layer form at least part of a gate structure of a FeFET.

7. The integrated circuit of claim 6, wherein the further additives are selected from the group consisting of Si, Al, Ge, Mg, Ca, Sr, Ba, Ti and rare earth elements.

8. The integrated circuit of claim 5, further comprising:
bitlines; and
wordlines;
wherein a gate of a transistor of the ferroelectric memory cell is electrically coupled to one of the wordlines and a source/drain region of the transistor of the ferroelectric memory cell is electrically coupled to one of the bitlines.

9. The integrated circuit of claim 1, wherein the oxide storage layer comprises, as main components, oxygen and hafnium.

10. The integrated circuit of claim 1, wherein the oxide storage layer is configured to store an information state.

11. The integrated circuit of claim 1, wherein the oxide storage layer is configured to be set in a first polarization state to store a first logical state and to be set in a second polarization state to store a second logical state.

12. The integrated circuit of claim 1, further comprising:
an insulating buffer layer, wherein the oxide storage layer is disposed between the insulating buffer layer and the covering layer.

13. The integrated circuit of claim 1, wherein the oxide storage layer is at least partly in a crystalline state.

14. The integrated circuit of claim 13, wherein at least a portion of a crystalline part of the oxide storage layer is in the ferroelectric state.

15. A ferroelectric memory cell comprising a storage layer and a covering layer disposed over the storage layer, the storage layer comprising:
an oxide storage layer that is at least partly in a ferroelectric state and comprises at least one of HfSiO, a mixed oxide comprising as main components hafnium oxide and zirconium oxide, and an oxide comprising as a main component one of hafnium oxide and zirconium oxide.

16. The ferroelectric memory cell of claim 15, wherein the oxide storage layer comprises at least one of an oxide comprising hafnium oxide as a main component and HfSiO.

17. The ferroelectric memory cell of claim 15, wherein the oxide storage layer further comprises at least one additive having a concentration within a range of 0.5% to 20%.

18. The ferroelectric memory cell of claim 17, wherein the at least one additive is selected from the group consisting of Si, Al, Ge, Mg, Ca, Sr, Ba, Ti and rare earth elements.

19. The ferroelectric memory cell of claim 15, further comprising an insulating buffer layer, wherein the oxide storage layer is disposed between the insulating buffer layer and the covering layer.

20. The ferroelectric memory cell of claim 15, wherein the oxide storage layer comprises hafnium oxide as a main component.

21. The ferroelectric memory cell of claim 15, wherein the oxide storage layer is configured to store an information state.

22. The ferroelectric memory cell of claim 15, wherein the oxide storage layer is configured to be set in a first polarization state to store a first logical state and to be set in a second polarization state to store a second logical state.

23. The ferroelectric memory cell of claim 15, wherein the covering layer comprises a conductive material.

24. The ferroelectric memory cell of claim 15, further comprising a conductive layer over the covering layer.

25. The ferroelectric memory cell of claim 15, wherein the oxide storage layer and the covering layer form at least part of a gate structure of a FeFET.

26. The ferroelectric memory cell of claim 15, wherein the oxide storage layer and the covering layer form at least part of a capacitor of a FeRAM.

27. The ferroelectric memory cell of claim 25, further comprising:
bitlines; and
wordlines;
wherein a gate of a transistor of the ferroelectric memory cell is electrically coupled to one of the wordlines and a source/drain region of the transistor of the ferroelectric memory cell is electrically coupled to one of the bitlines.

28. The ferroelectric memory cell of claim 15, wherein the oxide storage layer is at least partly in a crystalline state.

29. The ferroelectric memory cell of claim 28, wherein at least a portion of a crystalline part of the oxide storage layer is in the ferroelectric state.

* * * * *